US012813059B2

(12) United States Patent
Kanematsu et al.

(10) Patent No.: US 12,813,059 B2
(45) Date of Patent: Nov. 24, 2026

(54) SOLAR CELL MODULE AND METHOD FOR MANUFACTURING SOLAR CELL MODULE

(71) Applicant: Panasonic Holdings Corporation, Osaka (JP)

(72) Inventors: Daiji Kanematsu, Osaka (JP); Hirotaka Katayama, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 18/948,845

(22) Filed: Nov. 15, 2024

(65) Prior Publication Data

US 2025/0072199 A1 Feb. 27, 2025

Related U.S. Application Data

(63) Continuation of application No. PCT/JP2023/018128, filed on May 15, 2023.

(30) Foreign Application Priority Data

May 20, 2022 (JP) ................................ 2022-082874

(51) Int. Cl.
*H10K 30/82* (2023.01)
*H10K 30/50* (2023.01)
*H10K 30/88* (2023.01)

(52) U.S. Cl.
CPC ............ *H10K 30/82* (2023.02); *H10K 30/50* (2023.02); *H10K 30/88* (2023.02)

(58) Field of Classification Search
None
See application file for complete search history.

(56) References Cited

U.S. PATENT DOCUMENTS

| | | | |
|---|---|---|---|
| 2004/0248394 A1 | 12/2004 | Kobayashi et al. |
| 2008/0038529 A1 | 2/2008 | Nakayama et al. |
| 2011/0121352 A1 | 5/2011 | Hesse et al. |
| 2012/0006406 A1 | 1/2012 | Usui et al. |

(Continued)

FOREIGN PATENT DOCUMENTS

| | | |
|---|---|---|
| JP | 2000-112400 | 4/2000 |
| JP | 2003-123857 | 4/2003 |

(Continued)

OTHER PUBLICATIONS

Guillen et al. Thin Solid Films, 520, (2011), 1-17. (Year: 2011).*

(Continued)

*Primary Examiner* — Eli S Mekhlin
(74) *Attorney, Agent, or Firm* — GREENBLUM & BERNSTEIN, P.L.C.

(57) ABSTRACT

A solar cell module of an embodiment comprises a first substrate, a second substrate, a photoelectric conversion layer, a first electrode layer, a second electrode layer, and an extraction electrode layer. The extraction electrode layer includes a metal layer and a transparent conductive layer that are stacked on each other, and is provided in a region on the first substrate that does not overlap the photoelectric conversion layer when the substrate is viewed in plan. The solar cell module further comprises a glass frit portion provided between the second substrate and the extraction electrode layer.

11 Claims, 6 Drawing Sheets

(56) References Cited

U.S. PATENT DOCUMENTS

| | | | |
|---|---|---|---|
| 2015/0056736 | A1 | 2/2015 | Beck |
| 2016/0203918 | A1 | 7/2016 | Hinsch et al. |
| 2016/0268550 | A1 | 9/2016 | Riedel et al. |
| 2017/0062748 | A1 | 3/2017 | Jung et al. |
| 2019/0019628 | A1 | 1/2019 | Higuchi |
| 2019/0081190 | A1 | 3/2019 | Naito et al. |

FOREIGN PATENT DOCUMENTS

| | | |
|---|---|---|
| JP | 2006-352044 | 12/2006 |
| JP | 2011-54477 | 3/2011 |
| JP | 5455481 | 3/2014 |
| JP | 2016-63189 | 4/2016 |
| JP | 2016-531443 | 10/2016 |
| JP | 2019-21913 | 2/2019 |
| JP | 2019-50106 | 3/2019 |
| WO | 2006/030762 | 3/2006 |
| WO | 2010/098311 | 9/2010 |
| WO | 2014/181765 | 11/2014 |

OTHER PUBLICATIONS

International Search Report issued in International Patent Application No. PCT/JP2023/018128, dated Jun. 27, 2023, along with an English translation thereof.

Extended European search report issued in the corresponding European Patent Application No. 23807607.9, dated Jul. 16, 2025.

Emami Seyedali et al: "Advanced hermetic encapsulation of perovskite solar cells: the route to commercialization", Journal of Materials Chemistry A, vol. 8, No. 5, Jan. 1, 2020 (Jan. 1, 2020), pp. 2654-2662, XP093293987, GB, ISSN: 2050-7488, DOI: 10.1039/c9ta11907h.

* cited by examiner

SOLAR CELL MODULE AND METHOD FOR MANUFACTURING SOLAR CELL MODULE

CROSS-REFERENCE TO RELATED APPLICATION

The present application is a continuation under 35 U.S.C. § 120 of PCT/JP2023/018128, filed May 15, 2023, which is incorporated herein by reference and which claimed priority to Japanese Patent Application No. 2022-082874 filed May 20, 2022. The present application likewise claims priority under 35 U.S.C. § 119 to Japanese Patent Application No. 2022-082874 filed May 20, 2022, the entire content of which is also incorporated herein by reference.

TECHNICAL FIELD

The present disclosure relates to solar cell modules and manufacturing methods thereof, and more particularly relates to a solar cell module having a photoelectric conversion layer formed on an insulating substrate, such as a glass substrate, and a manufacturing method thereof.

BACKGROUND ART

There has conventionally been known a solar cell module having a photoelectric conversion layer formed on an insulating substrate such as a glass substrate. For example, Patent Literature 1 discloses a solar cell module comprising a substrate, an element part formed on the substrate, and a sealing member that seals the element part, the element part being formed with a plurality of perovskite solar cells as unit cells. Patent Literature 1 discloses that resin such as butyl rubber is used as the sealing member.

Patent Literature 2 also discloses a structure in an organic EL display device, in which two glass substrates are bonded to each other using glass frit that is formed into a linear shape to seal an organic thin film layer serving as a light emitting layer. According to Patent Literature 2, the glass frit is cured by laser light irradiation along the line-shaped glass frit, and ultraviolet curing resin is used for a second sealing region where metal wiring is arranged.

CITATION LIST

Patent Literature

PATENT LITERATURE 1: Japanese Unexamined Patent Application Publication No. 2019-021913

PATENT LITERATURE 2: Japanese Unexamined Patent Application Publication No. 2011-054477

SUMMARY

Although curing the glass frit requires, for example, heating by laser irradiation as described above, the inventors of the present invention have found out as a result of examination that irradiating the metal wiring with laser light damages the wiring and increases resistance. Hence, in the device in Patent Literature 2, ultraviolet curing resin is used instead of the glass frit in the second sealing region where the metal wiring is arranged.

While the solar cell module comprises an extraction electrode layer for extracting electric energy from the photoelectric conversion layer, there is a problem that the electrode layer is damaged and resistance increases when the glass frit is provided in the region where the extraction electrode layer is arranged and is heated by laser irradiation or the like.

A solar cell module according to one aspect of the present disclosure comprises: a first substrate; a first electrode layer provided on the first substrate; a photoelectric conversion layer provided on the first electrode layer; a second electrode layer provided on the photoelectric conversion layer; extraction electrode layers provided in regions on the first substrate not overlapping with the photoelectric conversion layer in plan view of the substrate, the extraction electrode layers each being made of a laminate of a metal layer and a transparent conductive layer; a second substrate provided so as to cover the first electrode layer, the photoelectric conversion layer, the second electrode layer, and the extraction electrode layers; and a glass frit part provided between the second substrate and the extraction electrode layers.

A manufacturing method of a solar cell module according to one aspect of the present disclosure comprises: a first step of forming a first electrode layer, a photoelectric conversion layer, and a second electrode layer on a first substrate, in order, and also forming extraction electrode layers, each made of a laminate of a metal layer and a transparent conductive layer, in regions not overlapping with the photoelectric conversion layer in plan view of the first substrate; a second step of providing a glass frit material on the second substrate; a third step of arranging the second substrate on the first substrate to put the extraction electrode layers prepared in the first step and the glass frit material prepared in the second step into contact with each other; and a fourth step of bonding and fixing the extraction electrode layers and the second substrate using the glass frit material.

According to the one aspect of the present invention, in the solar cell module having glass frit provided in the region where the extraction electrode layers are arranged, the increase in resistance can be suppressed. In the case where the glass frit is annularly provided so as to surround the photoelectric conversion layer to seal the photoelectric conversion layer, sealing performance is greatly enhanced compared with the case where, for example, a resin sealing material is partially used around the photoelectric conversion layer.

DESCRIPTION OF EMBODIMENTS

Figure 1:
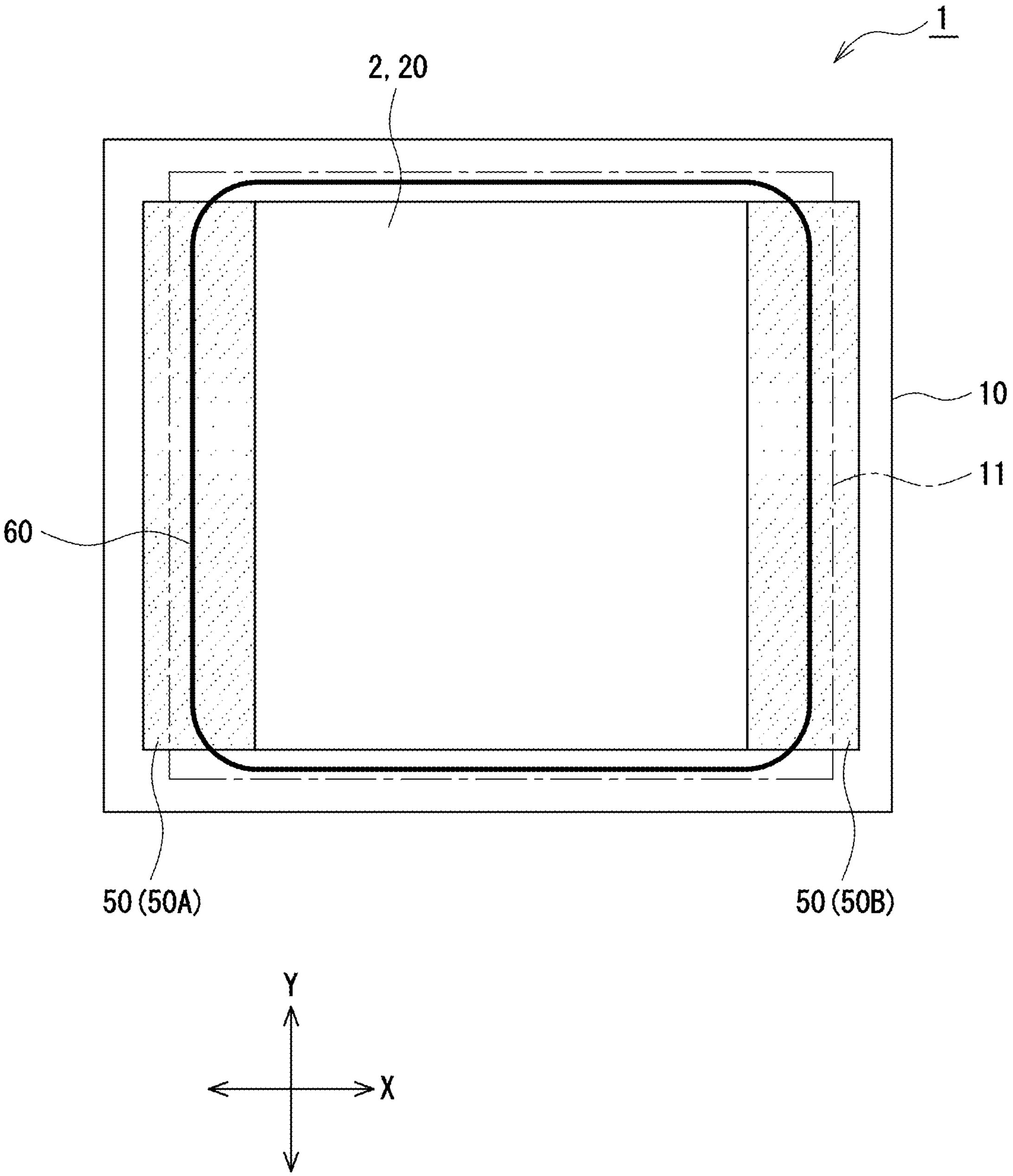
FIG. 1 is a plan view of a solar cell module as an example of an embodiment.
Figure 2:
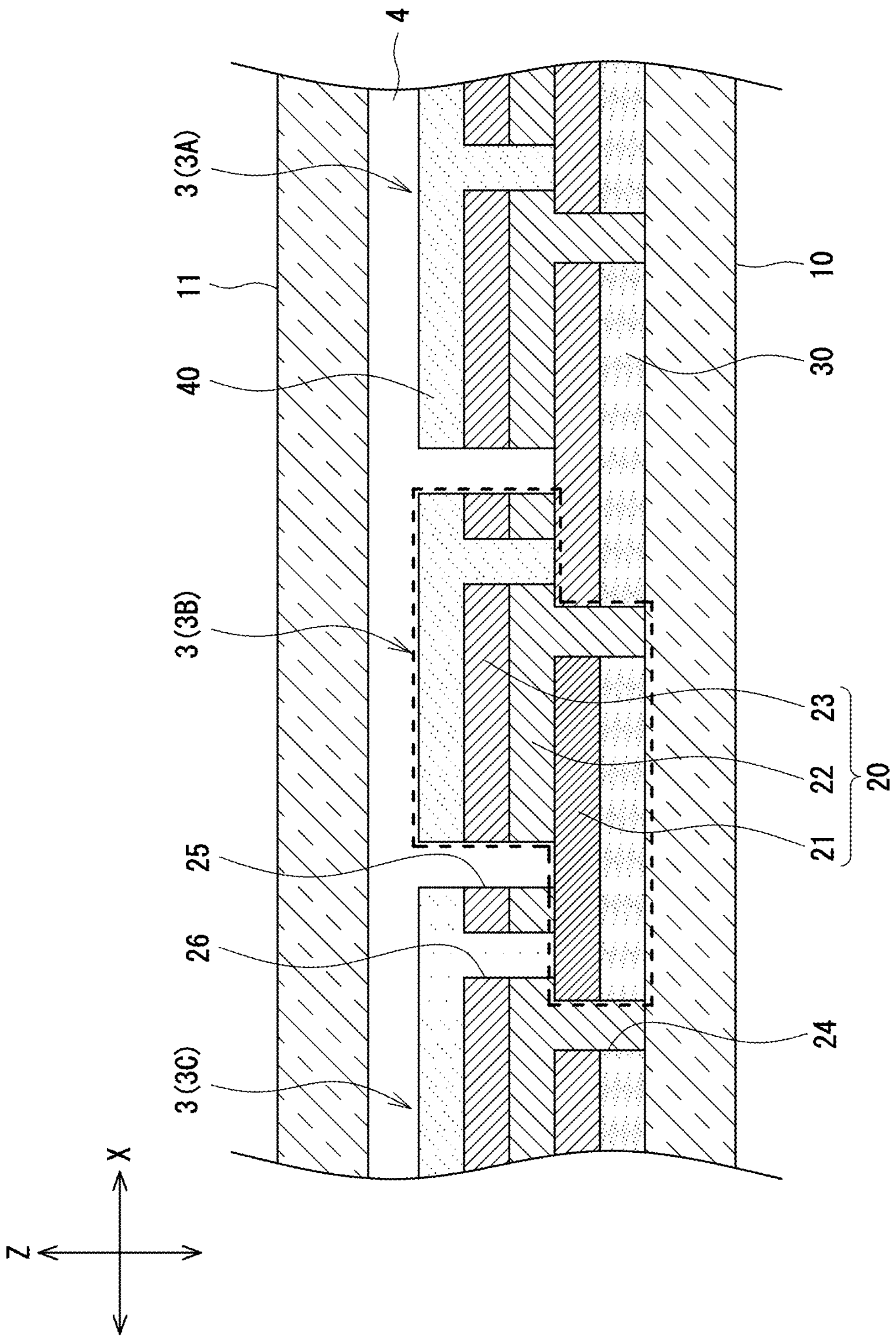
FIG. 2 is a sectional view of the solar cell module as an example of the embodiment, for showing a sectional structure of a portion where a solar cell is formed.

FIG. 1 is a plan view schematically showing a solar cell module 1 as an example of an embodiment. FIG. 2 is a sectional view of the solar cell module 1 for showing a portion where a cell 2 is formed. In FIG. 1, illustration of a second substrate 11 is omitted, and an outline of the second substrate 11 is illustrated by an alternate long and short dash line.

As shown in FIGS. 1 and 2, the solar cell module 1 comprises a cell 2 including a photoelectric conversion layer 20, a first electrode layer 30, and a second electrode layer 40, a first substrate 10, and the second substrate 11 that is arranged facing the first substrate 10 to cover the cell 2. The solar cell module 1 further comprises extraction electrode layers 50 for extracting electrical energy from the cell 2, and a glass frit part 60 that bonds the two substrates. The glass frit part 60 is provided between the second substrate 11 and the extraction electrode layers 50, and functions as a sealing material for sealing the cell 2.

In the present embodiment, a light transmissive substrate is used as the first substrate 10. The first substrate 10, the second substrate 11, and the cell 2 are formed into a rectangular shape in plan view, and the second substrate 11, which is slightly smaller than the first substrate 10, covers the entire cell 2 that is formed on the first substrate 10.

For the first substrate 10 and the second substrate 11, an insulating substrate is preferably used, though a conductive substrate with an insulating layer formed on the surface may be used. The first substrate 10 is preferably constituted of a material having transparency to sunlight in a wavelength range of greater than or equal to 400 nm and less than or equal to 1000 nm, and having low water vapor permeability. Furthermore, the first substrate 10 is preferably a glass substrate in terms of adhesiveness and heat resistance in a fusing step of the glass frit. The first substrate 10 has a thickness of, for example, greater than or equal to 0.3 mm and less than or equal to 3 mm.

The second substrate 11 is preferably transparent to laser light, and may be a transparent substrate such as a glass substrate. Like the first substrate 10, the second substrate 11 is preferably constituted of a material having low water vapor permeability. The second substrate 11 may have a thickness that is less than or equal to the thickness of the first substrate 10. Here, a gas barrier layer, such as an alumina layer, may be formed on the surfaces of the first substrate 10 and the second substrate 11. In the present embodiment, a flat and transparent glass substrate is used as the first substrate 10 and the second substrate 11.

The solar cell module 1 comprises the first electrode layer 30 provided on the first substrate 10, the photoelectric conversion layer 20 provided on the first electrode layer 30, and the second electrode layer 40 provided on the photoelectric conversion layer 20. The photoelectric conversion layer 20, the first electrode layer 30, and the second electrode layer 40 constitute the cell 2. On the first substrate 10, the extraction electrode layers 50 are also provided in regions not overlapping with the photoelectric conversion layer 20 in plan view of the substrate. The extraction electrode layers 50 each have a multilayer structure, in which a metal layer 52 and a transparent conductive layer are laminated. The transparent conductive layer is provided closer to the second substrate 11 than the metal layer 52, and is in contact with the glass frit part 60 (see FIG. 3 described later).

In the present embodiment, the glass frit part 60 is provided in an annular shape surrounding the photoelectric conversion layer 20 (cell 2) as viewed from a Z direction that is a laminating direction of the first electrode layer 30, the photoelectric conversion layer 20, and the second electrode layer 40. The extraction electrode layers 50 extend from two opposite sides of the cell 2 in directions away from each other, and are formed up to the vicinity of the ends of the first substrate 10 beyond the range covered with the second substrate 11. The glass frit part 60 includes a first region provided between the second substrate 11 and the extraction electrode layers 50, and a second region provided between the first substrate 10 and the second substrate 11. The glass frit part 60, like the first substrate 10 and the second substrate 11, has low water vapor permeability and exhibits excellent sealing performance.

In the solar cell module 1, there is formed internal space 4 sealed by the first substrate 10, the second substrate 11, and the glass frit part 60. The cell 2 is arranged in the internal space 4. The distance between the first substrate 10 and the second substrate 11 is, for example, greater than or equal to 1 μm and less than or equal to 30 μm, and there is a gap between the cell 2 and the second substrate 11. Inert gas, such as nitrogen gas, may be sealed in the internal space 4 of the solar cell module 1. Alternatively, the internal space 4 may be filled with resin, such as ethylene vinyl acetate copolymer (EVA) resin, silicone resin, and polyolefin.

The configuration of the cell 2, which is one example of the embodiment, is described in detail below. FIG. 2 shows an example of a suitable layer structure of the solar cell, though the layer structure of the cell is not limited to this.

As shown in FIG. 2, the cell 2 is constituted of a plurality of unit cells 3 that are connected in series. The unit cells 3 are arranged in plurality in an X direction that is a first direction along the surface of the first substrate 10 and are continuous in a Y direction that is orthogonal to the X direction (see FIG. 1). The unit cells 3 each have a pair of electrodes (first electrode layer 30 and second electrode layer 40) and the photoelectric conversion layer 20 arranged between the pair of electrodes. The cell 2 is, for example, a perovskite type solar cell. In the present embodiment, the first substrate 10 has light transparency, and the photoelectric conversion layer 20 absorbs light that is incident into the module from the side of the first substrate 10 to generate electricity.

The first electrode layer 30 has light transparency and does not block light from entering the photoelectric conversion layer 20. The first electrode layer 30 has light transmittance of, for example, greater than or equal to 85% in the range of wavelengths greater than or equal to 450 nm and less than or equal to 900 nm. The first electrode layer 30 preferably has a sheet resistance of less than or equal to 40 Ω/square and may have a sheet resistance of less than or equal to 10 Ω/square. The first electrode layer 30 preferably has a single layer structure constituted of a transparent conductive layer. The transparent conductive layer is constituted of transparent conductive oxide, such as indium tin oxide (ITO), as described in detail later.

In the present embodiment, the second electrode layer 40 may not have light transparency, and includes the metal layer 42 and the transparent conductive layer. The second electrode layer 40, which includes a first transparent conductive layer 41 and a second transparent conductive layer 43 as the transparent conductive layer, has a multilayer structure in which the first transparent conductive layer 41, the metal layer 42, and the second transparent conductive layer 43 are laminated in order from the side of the first substrate 10. As will be discussed in more detail later, the metal layer is constituted of metal, such as aluminum, nickel, copper, and silver, or an alloy of these.

The photoelectric conversion layer 20 includes an electron transport layer 21, a light absorbing layer 22 arranged on the electron transport layer 21, and a hole transport layer 23 arranged on the light absorbing layer 22. The photoelectric conversion layer 20 has, with the exception of groove-formed portions that will be described later, the multilayer structure in which the electron transport layer 21, the light absorbing layer 22, and the hole transport layer 23 are laminated in order from the side of the first substrate 10. The light absorbing layer 22 contains, for example, a perovskite compound represented by a composition formula $ABX_3$ (in the formula, A is a monovalent cation, B is a divalent cation, and X is a halogen anion).

Examples of an electron transport material constituting the electron transport layer 21 may include anatase type titanium oxide, and tin oxide. The hole transport layer 23 contains a hole transport material having a redox site. Examples of the hole transport material constituting the hole transport layer 23 may include 2,2',7,7'-tetrakis (N,N'-di-p-methoxyphenylamino)-9,9'-spirobifluorene (Spiro-OMeTAD).

An example of A in the perovskite compound ($ABX_3$) is a monovalent cation expressed by $R_1R_2R_3$—N—H. When $R_1$ and $R_2$ are H and $R_3$ is $CH_3$, then A is methylammonium ($CH_3NH_3$). Functional groups $R_1$, $R_2$, and $R_3$ contain at least one element selected from the group consisting of, for example, carbon, hydrogen, nitrogen, and oxygen. When the functional groups $R_1$, $R_2$, and $R_3$ contain a carbon atom, the total number of carbon atoms of the functional groups $R_1$, $R_2$, and $R_3$ is preferably less than or equal to 4. The functional groups $R_1$, $R_2$, and $R_3$ may contain a group 1 element, such as Rb and Cs.

As described above, B in $ABX_3$ is a divalent cation. For example, B is a divalent cation of transition metal or a group 13 element, a group 14 element, or a group 15 element. Specific examples of B may include $Pb^{2+}$, $Ge^{2+}$, and $Sn^{2+}$. B may contain at least one element selected from the group consisting of $Pb^{2+}$ and $Sn^{2+}$, and part of $Pb^{2+}$ or $Sn^{2+}$ may be substituted with another element. Examples of the substituted element may include Bi, Sb, In, Ge, and Ni. X in $ABX_3$ is at least one element selected from the group consisting of Cl, Br, and I.

The respective sites of A, M, and X may be occupied by a plurality of kinds of ions. Specific examples of the perovskite compound ($ABX_3$) may include $CH_3NH_3PbI_3$, $CH_3CH_2NH_3PbI_3$, $NH_2CHNH_2PbI_3$, $CH_3NH_3PbBr_3$, $CH_3NH_3PbCl_3$, $CsPbI_3$, and $CsPbBr_3$.

In the present embodiment, as shown in FIG. 2, the first electrode layer 30 of a unit cell 3A is electrically connected to the second electrode layer 40 of a unit cell 3B adjacent in the X direction. The first electrode layer 30 of the unit cell 3B is electrically connected to the second electrode layer 40 of a unit cell 3C. In this way, the plurality of unit cells 3 are connected in series in the X direction. The cell 2 also has a plurality of grooves 24, 25, and 26. The grooves 24, 25 and 26 are formed to extend, for example, in the Y direction and to be substantially parallel to each other. The respective grooves can be formed by a conventionally known scribing method or the like.

The groove 24 is a groove that divides the electron transport layer 21 and the first electrode layer 30 of each of the unit cells 3. The groove 24 has a width of, for example, greater than or equal to 20 μm and less than or equal to 150 μm. The groove 25 is a groove that divides the light absorbing layer 22, the hole transport layer 23, and the second electrode layer 40 of each of the unit cells 3. Note that the groove 25 is only required to divide the second electrode layer 40 of each of the unit cells 3, and the groove 25 may not divide the light absorbing layer 22 and the hole transport layer 23. The groove 25 has a width of, for example, greater than or equal to 30 μm and less than or equal to 150 μm. In the present embodiment, each of the unit cells 3 is defined by the grooves 24 and 25.

In each of the unit cells 3, the groove 26 is formed to penetrate the light absorbing layer 22 and the hole transport layer 23, and to expose the electron transport layer 21. In the groove 26, the second electrode layer 40 is formed, which is connected to the electron transport layer 21 of the adjacent unit cell 3. Thus, the second electrode layer 40 is electrically connected to the first electrode layer 30 of the adjacent unit cell 3. In other words, the groove 26 functions as a groove for connecting the unit cells. The groove 26 has a width of, for example, greater than or equal to 150 μm and less than or equal to 300 μm.

For example, the cell 2 is manufactured by the following method, including:

(1) forming the first electrode layer 30 and the electron transport layer 21 in order on the first substrate 10;
(2) performing laser scribing on part of the first electrode layer 30 and the electron transport layer 21 to form the grooves 24;
(3) forming the light absorbing layer 22 and the hole transport layer 23 in order on the electron transport layer 21;
(4) performing mechanical scribing on part of the light absorbing layer 22 and the hole transport layer 23 to form the grooves 26;
(5) forming the second electrode layer 40 on the hole transport layer 23; and
(6) performing mechanical scribing on part of the light absorbing layer 22, the hole transport layer 23, and the second electrode layer 40 to form the grooves 25.

The electron transport layer 21, the light absorbing layer 22, and the hole transport layer 23 can be formed, for example, by applying solutions prepared by dissolving a raw material to the surface of the first substrate 10. These layers may be formed by a spin coating method. The thickness of each layer, which is not particularly limited, is greater than or equal to 10 nm and less than or equal to 100 nm in one example.

Figure 3:
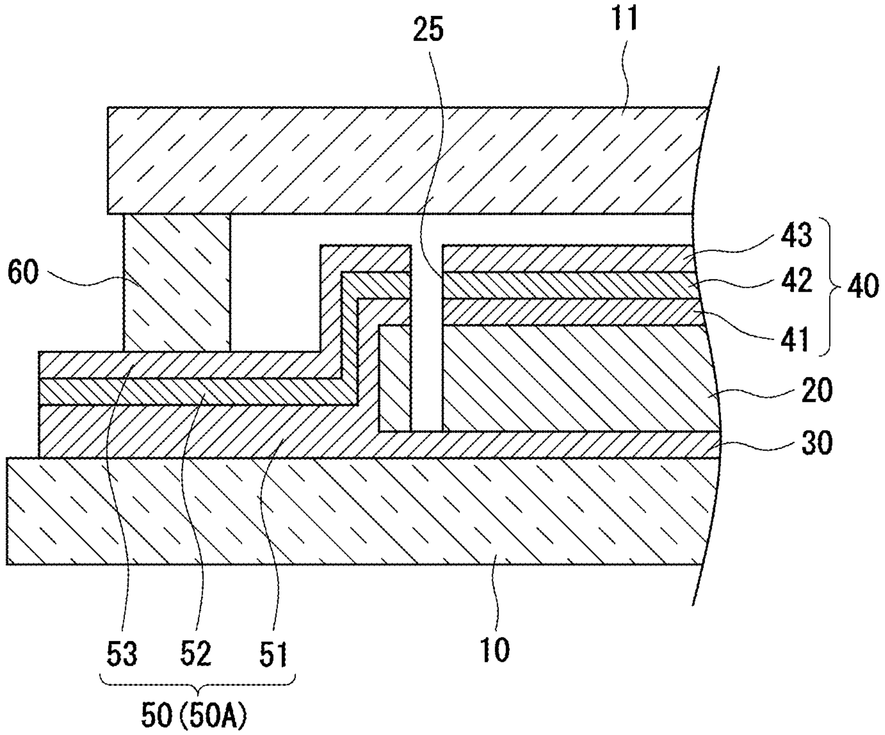
FIG. 3 is a sectional view of the solar cell module as an example of the embodiment, for showing a sectional structure of an end of the module.
Figure 4:
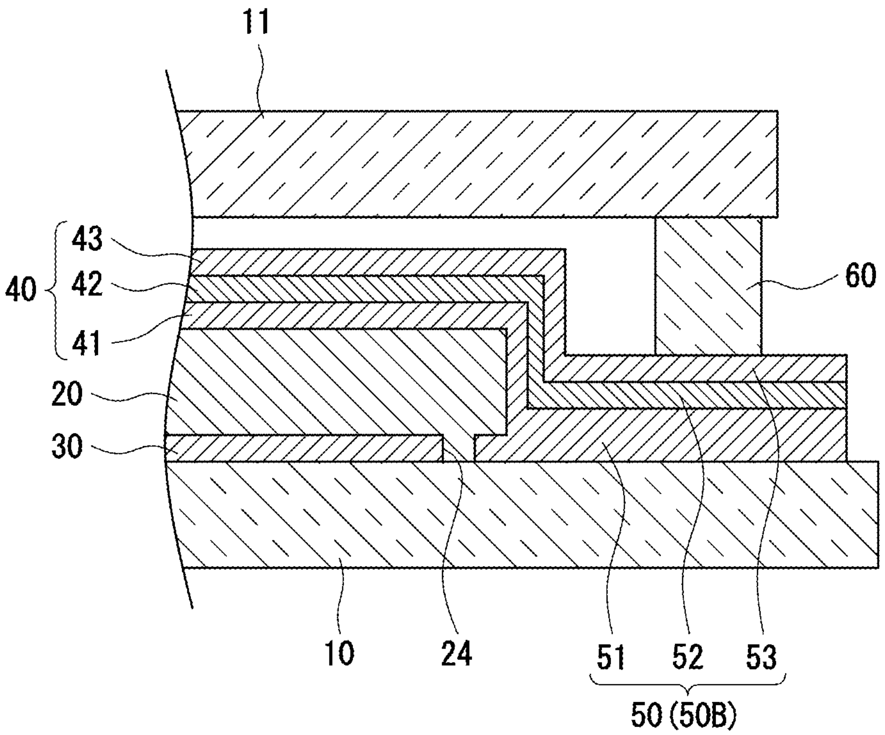
FIG. 4 is a sectional view of the solar cell module as an example of the embodiment, for showing a sectional structure of another end of the module.

The configuration of the extraction electrode layers 50 and the glass frit part 60 is described in detail below with reference to FIGS. 3 and 4. FIGS. 3 and 4 are sectional views of both the ends of the solar cell module 1 in the X direction, where the extraction electrode layer 50 is formed.

As shown in FIGS. 3 and 4, the extraction electrode layers 50 are each a conductive layer including the metal layer 52 and the transparent conductive layer. The extraction electrode layers 50 are each formed, from the internal space 4 toward the end of the first substrate 10, beyond the position where the glass frit part 60 is provided. The extraction electrode layers 50 are arranged in regions on the first substrate 10 not overlapping with the photoelectric conversion layer 20 (cell 2) in plan view of the first substrate 10. In other words, conductive layers formed in the regions not overlapping with the photoelectric conversion layer 20 and pulled out from the internal space 4 to the outside are the extraction electrode layers 50. As will be discussed later in detail, when the extraction electrode layers 50, each of which has a multilayer structure including the metal layer 52 and the transparent conductive layer, are used, excellent adhesiveness with the glass frit part 60 is achieved, and the increase in resistance of the extraction electrode layers 50 is suppressed.

The extraction electrode layers 50 include an extraction electrode layer 50A (see FIG. 3) electrically connected to the first electrode layer 30 and an extraction electrode layer 50B (see FIG. 4) electrically connected to the second electrode layer 40. The extraction electrode layer 50A is formed at a first end of the first substrate 10 in the X direction, and the extraction electrode layer 50B is formed at a second end that is opposite to the first end in the X direction. Note that both the extraction electrode layers 50A and 50B include the metal layer 52 and the transparent conductive layer, and have the same layer structure.

The transparent conductive layer constituting each of the extraction electrode layers 50 preferably includes a first transparent conductive layer 51 and a second transparent conductive layer 53. The extraction electrode layers 50 each have a multilayer structure in which the first transparent conductive layer 51, the metal layer 52, and the second transparent conductive layer 53 are laminated in order from the side of the first substrate 10. In other words, the extraction electrode layers 50 each have a three-layer structure in which the metal layer 52 is held between the transparent conductive layers 51 and 53. The glass frit part 60 is provided between the second substrate 11 and each of the extraction electrode layers 50, the glass frit part 60 being in contact with the transparent conductive layer 53.

In the present embodiment, the second electrode layer 40 has the same multilayer structure as the extraction electrode layers 50. As described above, the second electrode layer 40 includes the first transparent conductive layer 41, the metal layer 42, and the second transparent conductive layer 43, which are laminated on the photoelectric conversion layer 20 in order from the side of the first substrate 10. The extraction electrode layer 50B, which is electrically connected to the second electrode layer 40, is formed continuously to the second electrode layer 40 and is separated from the first electrode layer 30 by the groove 24. On the other hand, the extraction electrode layer 50A, which is electrically connected to the first electrode layer 30, is formed continuously to the first electrode layer 30 and is separated from the second electrode layer 40 by the groove 25.

Here, the respective layers of each of the extraction electrode layers 50 are formed at the same time as the first electrode layer 30 and the second electrode layer 40, and after this formation, the grooves 24 and 25 are formed, which results in separation of the respective layers from the first electrode layer 30 or the second electrode layer 40. The extraction electrode layers 50 may each be connected to part of the electrode layer formed on the photoelectric conversion layer 20 in regions adjacent to the grooves 24 and 25. Since the part of the electrode layer has a very small area, it does not affect the characteristics of the photoelectric conversion layer 20.

The transparent conductive layers 51 and 53 are generally constituted of transparent conductive oxide that is formed by doping metal oxide, such as indium oxide, and zinc oxide, with tungsten, tin, antimony, or the like. An example of a suitable transparent conductive oxide is indium tin oxide (ITO). The transparent conductive layers 51 and 53 are formed by, for example, sputtering to have substantially the same composition and thickness. An example of the thickness of the transparent conductive layers 51 and 53 is greater than or equal to 30 nm and less than or equal to 300 nm. Since the transparent conductive layers 51 and 53 are formed at the same time as the transparent conductive layer of the first electrode layer 30 and the transparent conductive layers 41 and 43 of the second electrode layer 40, each of the transparent conductive layers has substantially the same composition.

Examples of a constituent material of the metal layer 52 include metal, such as aluminum, nickel, copper, and silver, or alloy of these. Among them, silver is preferably used. The metal layer 52 may have a single layer structure or a multilayer structure. An example of the thickness of the metal layer 52 is greater than or equal to 80 nm and less than or equal to 500 nm. The metal layer 52 may be formed by, for example, sputtering, vapor deposition, or the like, or may be formed by a plating method. Since the metal layer 52 is formed at the same time as the metal layer 42 of the second electrode layer 40, the metal layers 42 and 52 have substantially the same composition.

The extraction electrode layer 50A is formed by overlapping the three layers, which are separated from the second electrode layer 40 by the groove 25, with the transparent conductive layer that is continuous from the first electrode layer 30. The extraction electrode layer 50B is formed by overlapping the three layers, which are continuous to the second electrode layer 40, with the transparent conductive layer separated by the groove 24 from the first electrode layer 30. Specifically, the transparent conductive layer 51 interposed between the first substrate 10 and the metal layer 52 is a transparent conductive layer derived from the first electrode layer 30 and the second electrode layer 40, and the thickness of the transparent conductive layer 51 is larger than the thickness of the transparent conductive layer 53 derived only from the second electrode layer 40.

As described above, the glass frit part 60 includes the first region provided between the second substrate 11 and the extraction electrode layers 50, and the second region provided between the first substrate 10 and the second substrate 11, and the glass frit part 60 closely adheres to the second substrate 11 and the extraction electrode layers 50 in the first region, and closely adheres to the first substrate 10 and the second substrate 11 in the second region. The glass frit part 60, which is formed in a fine line shape surrounding the entire periphery of the cell 2, functions as a sealing material for sealing the cell 2. The thickness of the glass frit part 60, which is not particularly limited, is greater than or equal to 0.1 mm and less than or equal to 1 mm in one example. The thickness of the glass frit part 60 is greater than the total thickness of the photoelectric conversion layer 20 and the extraction electrode layers 50.

The glass frit part 60 is constituted of a glass frit material mainly composed of glass that is lower in melting point than glass constituting the first substrate 10 and the second substrate 11. The glass frit material, for example, is glass powder with a low melting point, and most of individual fine particles of the glass have a particle size of greater than or equal to 1 μm and less than or equal to 50 μm. The composition of the low melting point glass is not particularly limited. For example, the low melting point glass may have $SiO_2$ as a main component and may include at least one element selected from the group consisting of Mg, Ca, Ba, Li, K, Na, Zn, Te, V, B, Pb, Al, Sn, P, Ru, Fe, Cu, Ti, W, Bi, and Sb. The glass frit material may also contain predetermined fillers or additives.

As will be described later in detail, the glass frit part 60 is formed by forming a line of a glass frit material on the first substrate 10 or the second substrate 11, laying the two substrates on top of each other, and then performing laser irradiation along the line. When the glass frit material is melted by laser irradiation, glass fine particles adhere to each other and also adhere to the substrates and the extraction electrode layers 50, and constitutes the dense glass frit part 60 with low water vapor permeability. The glass frit part 60 is a laser welded portion that is melted and solidified by laser irradiation and thereby bonds the two substrates.

The glass frit part 60 is arranged on the transparent conductive layer 53 of each of the extraction electrode layers 50 in the first region. This means that the glass frit part 60 is not in contact with the metal layer 52, and the transparent conductive layer 53 is interposed between the glass frit part 60 and the metal layer 52. The transparent conductive layer 53 is closer to glass in linear expansion coefficient and has higher heat resistance than the metal layer 52. Therefore, when the glass frit part 60 is arranged on the transparent conductive layer 53, the adhesiveness of the glass frit part 60 to the extraction electrode layer 50 is enhanced. Here, the transparent conductive layer 51 interposed between the first substrate 10 and the metal layer 52 enhances the adhesiveness of the extraction electrode layer 50 to the first substrate 10.

The glass frit part 60 is heated by laser irradiation, and during the laser irradiation, each of the extraction electrode layers 50, which overlap with the glass frit part 60, is also heated to high temperature, which may result in damage of the metal layer 52 due to the heat. In the present embodiment, since the metal layer 52 is held between the transparent conductive layers 51 and 53, the transparent conductive layers 51 and 53 maintain a good conductive path even when the metal layer 52 is damaged, and the increase in resistance of each of the extraction electrode layers 50 is sufficiently suppressed. This effect can also be obtained when only one of the transparent conductive layers 51 and 53 is provided, though the effect of suppressing the increase in resistance becomes more noticeable by providing the transparent conductive layers 51 and 53 that hold the metal layer 52.

Figure 5:
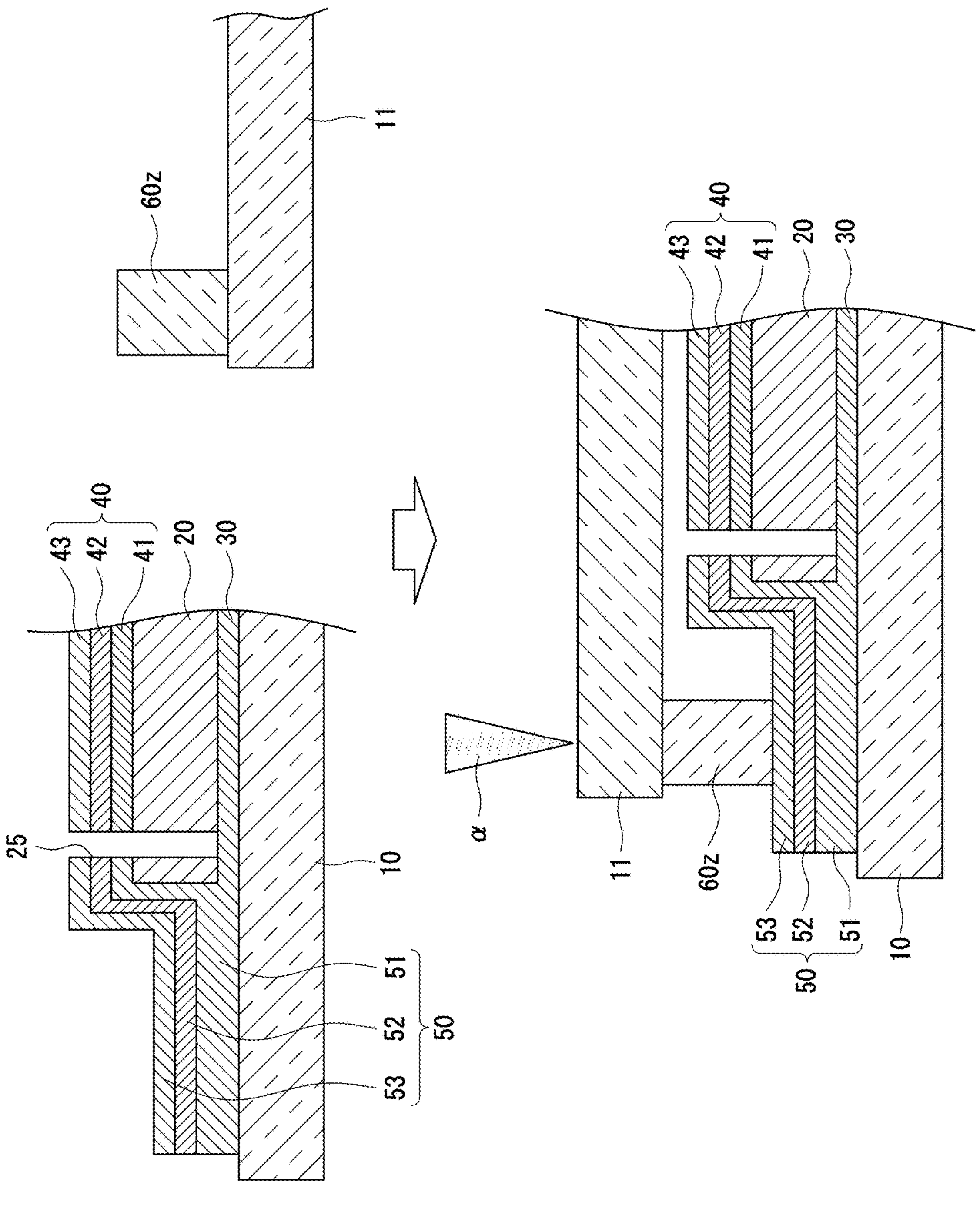
FIG. 5 is an explanatory view of a manufacturing method of a solar cell module as an example of the embodiment.

The manufacturing method of the solar cell module 1 having the above configuration is described in detail below with reference to FIG. 5. FIG. 5 shows the sectional structure of the first end of the solar cell module 1 in the X direction as in FIG. 3.

As shown in FIG. 5, the manufacturing process of the solar cell module 1 includes, for example, the following steps:

(1) a first step of forming the first electrode layer 30, the photoelectric conversion layer 20, and the second electrode layer 40 in order, and also forming the extraction electrode layers 50, each made of a laminate of a metal layer and a transparent conductive layer on the first substrate 10, in a region not overlapping with the photoelectric conversion layer 20 in plan view of the first substrate 10;

(2) a second step of providing a glass frit material 60*z* on the second substrate 11;

(3) a third step of arranging the second substrate 11 on the first substrate 10 to put the extraction electrode layers 50 prepared in the first step and the glass frit material 60*z* prepared in the second step into contact with each other; and (4) a fourth step of bonding and fixing the extraction electrode layers 50 and the second substrate 11 using the glass frit material 60*z*.

In the first step, the cell 2 including the first electrode layer 30, the photoelectric conversion layer 20, and the second electrode layer 40, is manufactured by the above method. The extraction electrode layers 50 are each formed at the same time as the first electrode layer 30 and the second electrode layer 40, and each include the transparent conductive layer 51, the metal layer 52, and the transparent conductive layer 53, as in the second electrode layer 40 in the present embodiment. Note that the second electrode layer 40 and the extraction electrode layers 50 can be formed in different steps. In that case, the second electrode layer 40 may be formed as a single layer structure comprising the metal layer 42. However, from the viewpoint of improving productivity, the second electrode layer 40 and the extraction electrode layers 50 are preferably formed at the same time, and the extraction electrode layers 50 each preferably include the same layer structure as the second electrode layer 40.

In the second step, the glass frit material 60*z* is provided by applying the glass frit material 60*z* on the second substrate 11 in the state of, for example, a paste containing organic solvent, and then volatilizing and removing the solvent by heat treatment. The paste of the glass frit material 60*z* is applied on the second substrate 11 using a conventionally known printing method. While the paste of the glass frit material 60*z* may be applied on the first substrate 10 having the extraction electrode layers 50 formed thereof, the paste of the glass frit material 60*z* is preferably formed on the second substrate 11 from a viewpoint of suppressing the heat effect on the cell 2 or the like. The glass frit material 60*z* is preferably formed annularly in a single line shape along the periphery of the second substrate 11.

In the third step, the glass frit part 60*z* is arranged on the extraction electrode layers 50 by laying the second substrate 11 on the first substrate 10 such that the surface of the second substrate 11 where the glass frit part 60*z* is provided is made to face the first substrate 10. In the present embodiment, the first region where the glass frit material 60*z* is arranged between the second substrate 11 and the extraction electrode layers 50, and the second region where the glass frit material 60*z* is arranged between the first substrate 10 and the second substrate 11, are formed. The glass frit part 60*z* in the first region is in contact with the transparent conductive layer 53 of each of the extraction electrode layers 50.

In the fourth step, the glass frit material 60*z* is irradiated with laser light α from the opposite side of the metal layer through the second substrate 11. The laser light α has a wavelength of greater than or equal to 800 nm and less than or equal to 1500 nm, for example. In the example shown in FIG. 5, irradiation of the laser beam α is performed along the line of the glass frit material 60*z* from the side of the second substrate 11. As a result, the glass frit material 60*z* is melted, and the glass fine particles that constitute the frit material closely adhere to each other and also closely adhere to the first substrate 10, the second substrate 11, and each of the extraction electrode layers 50. For a laser device, a YAG laser is used, for example.

In the fourth step, the glass frit material 60*z* is melted by irradiation of the laser light α and is thereby formed into the glass frit part 60 that functions as a sealing material. At this time, it may be assumed that the metal layer 52 of the each of the extraction electrode layers 50 is heated and damaged. However, since the metal layer 52 is held between the transparent conductive layers 51 and 53, the transparent conductive layers 51 and 53 can maintain a good conductive path even when the metal layer 52 breaks, for example. As a result, the increase in resistance of the extraction electrode layers 50 is sufficiently suppressed.

Figure 6:
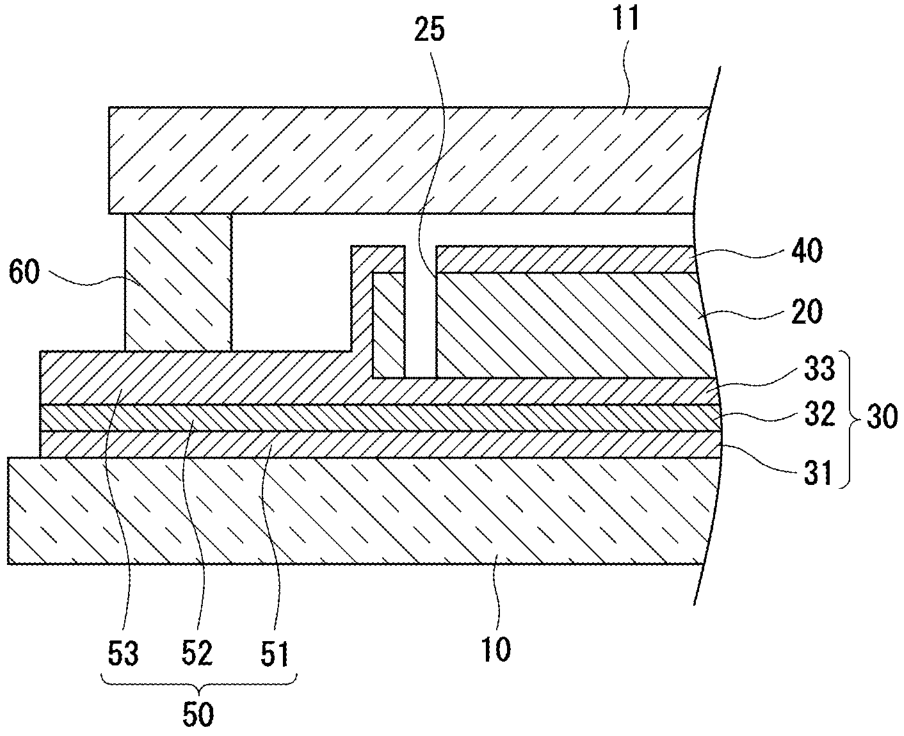
FIG. 6 is a sectional view of a solar cell module as another example of the embodiment.

FIG. 6 is a sectional view showing a modification of the above embodiment. The mode of the modification illustrated in FIG. 6 is similar to the above embodiment in that each of the extraction electrode layers 50 has a three-layer structure including the metal layer 52 and the transparent conductive layers 51 and 53, and that the glass frit part 60 is in contact with the transparent conductive layer 53. On the other hand, the mode is different from the embodiment in that the second electrode layer 40 has a single layer structure comprising a transparent conductive layer, and that the first electrode layer 30 has a three-layer structure including the metal layer 32 and transparent conductive layers 31 and 33. In the example shown in FIG. 6, the extraction electrode layer 50 is formed continuously to the first electrode layer 30.

In the mode illustrated in FIG. 6, the transparent conductive layer 53 interposed between the metal layer 52 and the glass frit part 60 is a transparent conductive layer derived from the first electrode layer 30 and the second electrode layer 40, and the thickness of the transparent conductive layer 53 is larger than the thickness of the transparent conductive layer 51 derived only from the first electrode layer 30. In this mode, light is allowed to be incident from the side of the second substrate 11 and, for example, the hole transport layer 23 is formed between the first electrode layer 30 and the light absorbing layer 22, and the electron transport layer 21 is formed between the light absorbing layer 22 and the second electrode layer 40.

As described in the foregoing, according to the thus-configured solar cell module 1, the glass frit part 60 is annularly provided over the entire periphery of the cell 2 including the regions where the extraction electrode layers 50 are formed, and therefore excellent sealing performance can be provided.

In order to demonstrate the sealing performance of the solar cell module 1, a durability test was conducted using a calcium film that is connected at both its ends to the extraction electrode layers 50 having a three-layer structure, under the conditions of temperature being 85° C. and humidity being 85%. The structure used in the test was similar to that of the solar cell module 1 except that the calcium film was used instead of the cell 2. When the calcium film absorbs water without excellent sealing performance, the resistance of the calcium film significantly increases. However, no increase in resistance was confirmed in the durability test. In other words, excellent sealing performance of the solar cell module 1 was demonstrated.

According to the solar cell module 1, even when the metal layer 52 of each of the extraction electrode layers 50 is damaged by irradiation of the glass frit material 60*z* with the laser light α, the transparent conductive layers 51 and 53 that hold the metal layer 52 therebetween suppress the increase in resistance of the extraction electrode layer 50.

Note that the above embodiment can be modified as appropriate within a range that does not impair the object of the present disclosure. For example, as heating means of the glass frit material, a heat press machine, a heating furnace, or the like, may be used instead of laser irradiation.

REFERENCE SIGNS LIST

1 Solar cell module, 2 Cell, 3 Unit cell, 4 Internal space, 10 First substrate, 11 Second substrate, 20 Photoelectric conversion layer, 21 Electron transport layer, 22 Light absorbing layer, 23 Hole Transport Layer, 24, 25, 26 Groove, 30 First electrode layer, 40 Second electrode layer, 41, 51 Transparent conductive layer, 42,52 Metal layer, 43, 53 Transparent conductive layer, 50 Extraction electrode layer, 60 Glass frit part

The invention claimed is:

1. A solar cell module, comprising:
a first substrate;
a first electrode layer provided on the first substrate;
a photoelectric conversion layer provided on the first electrode layer;
a second electrode layer provided on the photoelectric conversion layer;
first and second extraction electrode layers provided in regions on the first substrate not overlapping with the photoelectric conversion layer in plan view of the substrate;
a second substrate provided so as to cover the first electrode layer, the photoelectric conversion layer, the second electrode layer, and the first and second extraction electrode layers; and
a glass frit part provided between the second substrate and the first and second extraction electrode layers, wherein
the first extraction electrode layer electrically connected to the first electrode layer is formed continuously to the first electrode layer, and
the second extraction electrode layer electrically connected to the second electrode layer is formed continuously to the second electrode layer.

2. The solar cell module according to claim 1, wherein
each of the first and second extraction electrode layers has a multilayer structure including a transparent conductive layer, and
the glass frit part is in contact with the transparent conductive layer.

3. The solar cell module according to claim 2, wherein
the transparent conductive layer includes first and second transparent conductive layers,
the first and second extraction electrode layers each have a multilayer structure in which the first transparent conductive layer, and the second transparent conductive layer are laminated in order from a side of the first substrate, and
the glass frit part is in contact with the second transparent conductive layer.

4. The solar cell module according to claim 1, wherein
the first extraction electrode layer is separated from the second electrode layer by a second groove.

5. The solar cell module according to claim 1, wherein
the second extraction electrode layer is separated from the first electrode layer by a first groove.

6. The solar cell module according to claim 1, wherein
the glass frit part is provided in an annular shape surrounding the photoelectric conversion layer as viewed from a laminating direction of the first electrode layer, the photoelectric conversion layer, and the second electrode layer.

7. The solar cell module according to claim 1, wherein
the photoelectric conversion layer includes
an electron transport layer,
a light absorbing layer containing a perovskite compound represented by a composition formula $ABX_3$ (in the formula, A is a monovalent cation, B is a divalent cation, and X is a halogen anion), the light absorbing layer being arranged on the electron transport layer, and
a hole transport layer arranged on the light absorbing layer.

8. The solar cell module according to claim 1, wherein
the glass frit part includes a first region provided between the second substrate and the first and second extraction electrode layers, and a second region provided between the first substrate and the second substrate.

9. The solar cell module according to claim 1, wherein
the first and second extraction electrode layers extract electrical energy from a cell including the photoelectric conversion layer, the first electrode layer, and the second electrode layer.

10. The solar cell module according to claim 9, wherein each of the first and second extraction electrode layers is formed, from an internal space in which the cell is arranged to an end portion of the first substrate, beyond a position where the glass frit part is provided.

11. The solar cell module according to claim 1, wherein each of the first and second extraction electrode layers has a multilayered structure of a first layer and a second layer having a linear expansion coefficient closer to that of glass than the first layer does, and the glass frit part is arranged on the second layer.

* * * * *